United States Patent
Lin et al.

(10) Patent No.: US 10,911,016 B2
(45) Date of Patent: Feb. 2, 2021

(54) WIDEBAND BALUN

(71) Applicant: Analog Devices, Inc., Norwood, MA (US)

(72) Inventors: Song Lin, Burlington, MA (US); Mir A. Faiz, Andover, MA (US); Xudong Wang, Colorado Springs, CO (US); Donghyun Jin, Lyons (FR); Bin Hou, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/380,212

(22) Filed: Apr. 10, 2019

(65) Prior Publication Data

US 2020/0220516 A1 Jul. 9, 2020

Related U.S. Application Data

(60) Provisional application No. 62/789,789, filed on Jan. 8, 2019.

(51) Int. Cl.
| | | |
|---|---|---|
| *H03H 7/42* | (2006.01) | |
| *H01P 5/10* | (2006.01) | |
| *H03F 3/26* | (2006.01) | |

(52) U.S. Cl.
CPC ............. *H03H 7/42* (2013.01); *H01P 5/10* (2013.01); *H03F 3/26* (2013.01); *H03F 2200/06* (2013.01); *H03F 2200/09* (2013.01)

(58) Field of Classification Search
CPC .................................... H01P 5/10; H03H 7/42
(Continued)

(56) References Cited

U.S. PATENT DOCUMENTS

| | | |
|---|---|---|
| 4,954,790 A | 9/1990 | Barber |
| 5,060,298 A | 10/1991 | Waugh et al. |

(Continued)

FOREIGN PATENT DOCUMENTS

| | | |
|---|---|---|
| CN | 207587946 U | 7/2018 |
| DE | 69724469 T2 | 4/2004 |

(Continued)

OTHER PUBLICATIONS

Guo et al., "Design of Miniaturized LTCC Baluns" 2006 IEEE MTT-S International Microwave Symposium Digest, in 12 pages.
(Continued)

*Primary Examiner* — Dean O Takaoka
(74) *Attorney, Agent, or Firm* — Knobbe Martens Olson & Bear LLP (57) ABSTRACT

Wideband baluns with enhanced amplitude and phase balance are provided. The wideband balun includes a first transmission line connected between a first port and a third port, and a second transmission line connected between a second port and a fourth port, and a third transmission line connected between the third port and a reference voltage, such as ground. To enhance phase and/or amplitude balance of the wideband balun, the wideband balun further includes a compensation structure operable to provide at least one of capacitive compensation or inductive compensation to balance the wideband balun. For example, in certain implementations, the compensation structure includes at least one of (i) a capacitor connected between the first port and the second port or (ii) a fourth transmission line connected between the first transmission line and the third port.

20 Claims, 8 Drawing Sheets

(58) Field of Classification Search
USPC .................................................. 333/25, 26
See application file for complete search history.

(56) References Cited

U.S. PATENT DOCUMENTS

| | | | |
|---|---|---|---|
| 5,313,175 | A | 5/1994 | Bahl et al. |
| 5,355,104 | A | 10/1994 | Wolfson et al. |
| 5,523,728 | A | 6/1996 | McCorkle |
| 5,534,830 | A | 7/1996 | Ralph |
| 5,644,272 | A | 7/1997 | Dabrowski |
| 5,767,753 | A | 6/1998 | Ruelke |
| 5,867,072 | A | 2/1999 | Logothetis |
| 6,018,277 | A * | 1/2000 | Vaisanen ............ H01P 5/10 333/161 |
| 6,133,525 | A | 10/2000 | Yang et al. |
| 6,437,658 | B1 | 8/2002 | Apel et al. |
| 6,483,415 | B1 | 11/2002 | Tang |
| 6,670,866 | B2 | 12/2003 | Ella et al. |
| 6,683,510 | B1 | 1/2004 | Padilla |
| 6,819,200 | B2 | 11/2004 | Zhao et al. |
| 6,882,240 | B2 | 4/2005 | Apel |
| 6,954,116 | B2 | 10/2005 | Nosaka |
| 6,961,990 | B2 | 11/2005 | Logothetis |
| 7,183,872 | B2 | 2/2007 | Lee et al. |
| 7,215,218 | B2 | 5/2007 | Burns et al. |
| 7,265,644 | B2 | 9/2007 | Floyd et al. |
| 7,336,142 | B2 | 2/2008 | Vogel |
| 7,400,214 | B2 | 7/2008 | Storniolo et al. |
| 7,453,327 | B2 * | 11/2008 | Fluhrer ............ H01P 5/10 333/25 |
| 7,605,672 | B2 | 10/2009 | Kirkeby |
| 7,692,512 | B2 | 4/2010 | Podell |
| 7,741,929 | B2 | 6/2010 | Hash |
| 7,961,064 | B2 | 6/2011 | Kearns et al. |
| 8,547,186 | B2 | 10/2013 | Kirkeby |
| 8,598,964 | B2 | 12/2013 | Podell |
| 9,065,161 | B2 | 6/2015 | Hu et al. |
| 9,312,815 | B2 | 4/2016 | Wang et al. |
| 9,768,736 | B2 | 9/2017 | Qureshi |
| 9,787,279 | B2 * | 10/2017 | Tanaka ............ H01F 27/29 |
| 2007/0285189 | A1 | 12/2007 | Wu et al. |
| 2009/0243750 | A1 | 10/2009 | Podell |
| 2013/0321080 | A1 | 12/2013 | Jahanian et al. |
| 2016/0352303 | A1 | 12/2016 | Tutsumi et al. |
| 2017/0026201 | A1 | 1/2017 | Mei et al. |
| 2017/0279430 | A1 | 9/2017 | Qureshi |
| 2018/0123551 | A1 * | 5/2018 | Pye ............ H03F 3/60 |
| 2019/0051964 | A1 | 2/2019 | Senior et al. |

FOREIGN PATENT DOCUMENTS

| | | |
|---|---|---|
| EP | 0337191 | 10/1989 |
| EP | 0869574 B1 | 11/2005 |
| JP | H 06276045 | 9/1994 |
| JP | 2002217616 | 8/2002 |
| JP | 2004072115 A | 3/2004 |
| JP | 3728293 B2 | 12/2005 |
| JP | 2006270444 | 10/2006 |
| JP | 2011044961 | 3/2011 |
| JP | 4674590 B2 | 4/2011 |

OTHER PUBLICATIONS

Hsu et al., "Uniplanar Broad-Band Push-Pull FET Amplifier," IEEE Transactions on Microwave Theory and Techniques, vol. 45, No. 12, Dec. 1997, in 3 pages.

Lan et al., "An Ultra-Wideband Balun Using Multi-Metal GaAs MMIC Technology" IEEE Microwave and Wireless Components Letters, vol. 20, Aug. 2010, in 3 pages.

Lim et al., "A 800- to 3200-MHz Wideband CPW Balun Using Multistage Wilkinson Structure" IEEE Microwave Symp. Digest, pp. 1141-1144, Jun. 2006, in 4 pages.

Nelapati et al., "Design, Simulation, Fabrication and Testing of Improved Hybrid Wideband Balun Circuits at 2.4GHz" 2010 in 41 pages.

Rogers et al., "A 6 to 20 GHz Planar Balun Using a Wilkinson Divider and Lange Couplers" 1991 IEEE MTT-S International Microwave Symposium Digest, Boston, MA, in 4 pages.

Ruthroff, "Some Broad-Band Transformers" Proceedings of the IRE, vol. 47, Aug. 1959, pp. 1337-1342 in 6 pages.

Turrin, W2IMU, "Application of Broad-Band Balun Transformers," QST, Apr. 1969, pp. 42, 43, in 4 pages.

Watkins, "Enhancing Second Harmonic Suppression in an Ultra-Broadband RF Push-Pull Amplifier," High Frequency Design, pp. 32-40, Mar. 2014 in 7 pages.

Wu et al., "A Wideband Microstrip Dual Balun Structure" 2015 IEEE MTT-S International Microwave Symposium, in 3 pages.

Bhat et al. "Broadside-Coupled and Broadside Edge-Coupled Stripline-Like Transmission Lines with Anisotropic Substrates" dated Dec. 17, 1985, in 10 pages.

Bhat et al. "Unified Approach to Solve a Class of Strip and Microstrip-Like Transmission Lines" dated May 1982, in 8 pages.

Chiang et al. "Artificial-Synthesized Edge-Coupled Transmission Lines for Compact CMOS Directional Coupler Designs" dated Dec. 2009, in 8 pages.

Sevick, "Transmission Line Transformers", Noble Publishing Corporation, 2001, in 289 pages.

Yoon, et al., "A Silicon Monolithic Spiral Transmission Line Balun with Symmetrical Design", IEEE Electron Device Letters, 1999, in 3 pages.

* cited by examiner

WIDEBAND BALUN

CROSS-REFERENCE TO RELATED APPLICATIONS

The present application claims priority to U.S. Provisional Patent Application No. 62/789,789, filed Jan. 8, 2019, and titled "WIDEBAND BALUN," the entirety of which is hereby incorporated herein by reference.

FIELD OF THE DISCLOSURE

Embodiments of the invention relate to electronic systems, and more particularly, to baluns.

BACKGROUND

A balun can operate between a balanced differential transmission path and an unbalanced, single-ended transmission path. Baluns can be used in a wide variety of electronic devices, including, for example, radio frequency and microwave electronics. Example applications for baluns include push-pull amplifiers, mixers, phase shifters, impedance transformers, and antenna feeds.

SUMMARY OF THE DISCLOSURE

Wideband baluns with enhanced amplitude and phase balance are provided. The wideband balun includes a first transmission line connected between a first port and a third port, and a second transmission line connected between a second port and a fourth port, and a third transmission line connected between the third port and a reference voltage, such as ground. To enhance phase and/or amplitude balance of the wideband balun, the wideband balun further includes a compensation structure operable to provide at least one of capacitive compensation or inductive compensation to balance the wideband balun. For example, in certain implementations, the compensation structure includes at least one of (i) a capacitor connected between the first port and the second port or (ii) a fourth transmission line connected between the first transmission line and the third port.

In one aspect, a wideband balun with enhanced amplitude and phase balance is provided. The wideband balun includes a plurality of ports including a first port, a second port, a third port, and a fourth port, a first transmission line electrically connected between the first port and the third port, a second transmission line electrically connected between the second port and the fourth port and magnetically coupled to the first transmission line, a third transmission line electrically connected between the third port and a reference voltage, and a compensation structure electrically connected to the first transmission line and operable to provide at least one of capacitive compensation or inductive compensation to balance the wideband balun.

In another aspect, a semiconductor die having an integrated wideband balun is provided. The semiconductor die includes two or more metallization layers, a first transmission line formed in the two or more metallization layers and electrically connected between a first port and a third port, a second transmission line formed in the two or more metallization layers and electrically connected between a second port and a fourth port, and a third transmission line formed in the two or more metallization layers and electrically connected between the third port and a reference voltage. The first transmission line and the second transmission line are magnetically coupled. The semiconductor die further includes a compensation structure operable to compensate for imbalance between the second port and the third port.

In another aspect, a wideband balun is provided. The wideband balun includes a plurality of ports including a first port, a second port, a third port, and a fourth port, a first transmission line electrically connected between the first port and the third port, a second transmission line electrically connected between the second port and the fourth port and magnetically coupled to the first transmission line, a third transmission line electrically connected between the third port and a reference voltage, and means for compensating for an imbalance between the second port and the third port.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

To enhance integration of electronic systems operating in radio frequency (RF) and/or microwave frequency ranges, it is desirable to incorporate a balun in a semiconductor die, such as a monolithic microwave integrated circuit (MMIC). Advantages of integration include size reduction and large-scale production, which in turn results in lowered costs. Examples of fabrication processes suitable for MMICs include, but are not limited to, silicon processes and compound semiconductor processes, such as gallium arsenide (GaAs) or gallium nitride (GaN) technologies.

In certain configurations, a balun can receive a single-ended RF signal and output a differential RF signal, or vice versa. When outputting a differential RF signal, it is desirable for the non-inverted and inverted components of the differential RF signal to have equal amplitude, and a phase shift of 180 degrees. Examples of important performance parameters for broadband baluns include operating frequency range, insertion loss, amplitude balance, phase balance, and/or physical size.

Conventional coaxial-line or magnetic-core broadband baluns are limited in operation to relatively low frequencies. For example, as the operating frequency reaches 2 GHz or more, inductive and/or capacitive parasitics of the balun substantially impact insertion loss, phase balance, and/or amplitude balance of such baluns.

To extend bandwidth of operation, a balun can be fabricated using transmission lines rather than lumped inductors. In a first example, a coupled transmission line balun can be formed using coplanar striplines, also referred to as microstriplines, of conductive material positioned over a substrate and magnetically coupled to one another. In a second example, a coupled transmission line balun can be formed using a pair of stacked conductors positioned over a substrate and magnetically coupled to one another.

In certain applications, the phase and/or amplitude balance of a balun can impact the performance of an electronic system that incorporates the balun.

In a first example, a push-pull amplifier has a distortion impacted by a phase and/or amplitude balance of a balun. For instance, a push-pull amplifier balances out even harmonics at the amplifier's output leaving the third harmonic as the principal source of distortion, and thus possesses inherent spurious signal rejection of even order distortion. Thus, phase/amplitude balance is important to achieve high output second-order intercept point (OIP2) and/or second-order harmonic distortion (HD2) for the push-pull amplifier. While narrow-band push-pull power amplifiers can improve OIP2 over single-ended topologies, broadband push-pull amplifiers have been infeasible due to an absence of a broadband balun with small phase/amplitude imbalance.

In a second example, mixers (for instance, a single balanced mixer or double balanced mixer) have performance impacted by phase and/or amplitude balance. For example, even with small amplitude and/or phase errors, linearity performance (for instance, input second-order intercept point and/or input third-order intercept point) and/or port-to-port isolation (for instance, LO to RF and LO to IF isolation) is degraded. Moreover, larger errors of amplitude and/or phase balance will further impact the conversion gain and noise figure. Accordingly, a bandwidth of a passive mixer is limited by the bandwidth of the balun.

Wideband baluns are provided herein. In certain embodiments, a wideband balun includes a first transmission line and a second transmission line magnetically coupled to one another. The first transmission line is connected between a first port and a third port, and the second transmission line is connected between a second port and a fourth port. The wideband balun further includes a third transmission line connected between the third port and a reference voltage, such as ground. To enhance phase and/or amplitude balance of the wideband balun, the wideband balun further includes at least one of (i) a capacitor connected between the first port and the second port or (ii) a fourth transmission line connected between the first transmission line and the third port.

By implementing the balun in this manner, phase and/or amplitude balance of the balun is enhanced over a broadband frequency range. Such baluns can be used in a wide range of applications, including, but not limited to, push-pull amplifiers and/or mixers to achieve superior linearity and/or wider bandwidth.

The wideband baluns herein can handle signals of a variety of frequencies, including not only RF signals between 100 MHz and 7 GHz, but also signals of higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF systems, including microwave systems.

In contrast, conventional transformer baluns have a relatively narrow operating frequency range. For example, to achieve efficient magnetic coupling, a conventional transform balun can implement the self-impedances of the primary and secondary inductors to be relatively higher than the terminal impedance. Thus, the lowest frequency of operation of such baluns is limited by the amount of inductance in the balun, and the upper end of the operating frequency is limited by parasitic capacitance (for instance, due to resonance with the inductors). Such limitations hinder the ability of the conventional transformer balun to operate over a broad frequency range since the lowest frequency is based on sizing with large dimensions to achieve high inductance while the highest frequency is based on sizing with small dimensions to achieve low parasitic capacitance.

Moreover, ideal amplitude and phase balance between the plus and minus terminals of a conventional transformer balun requires perfect magnetic coupling between the primary and secondary windings. It is not even possible to achieve perfect magnetic coupling in the best environments, let alone the integrated circuit environment. Furthermore, the parasitic capacitance of the balanced winding can be unsymmetrical due to coupling of segments of the balanced windings to the grounded end of the unbalanced winding.

Figure 1A:
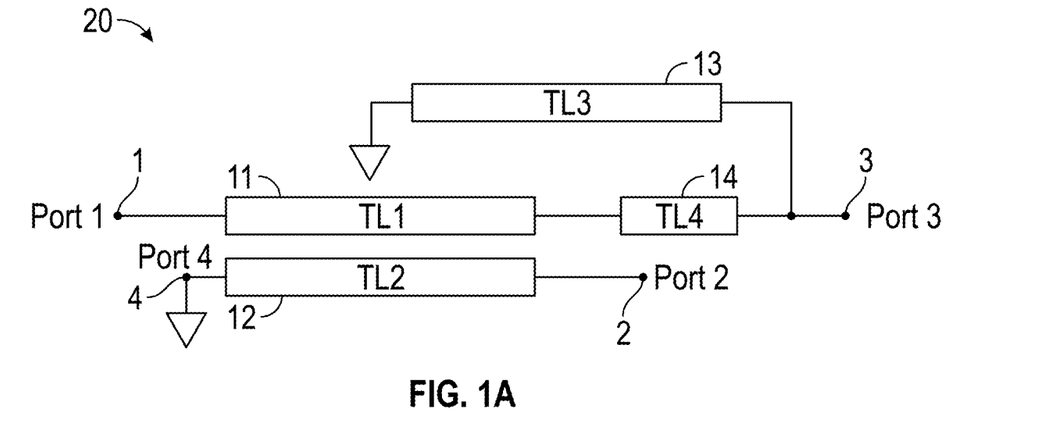
FIG. 1A is a schematic diagram of a wideband balun according to one embodiment.

FIG. 1A is a schematic diagram of a wideband balun 20 according to one embodiment. The wideband balun 20 includes a first port 1, a second port 2, a third port 3, a fourth port 4, a first transmission line 11, a second transmission line 12, a third transmission line 13, and a fourth transmission line 14.

As shown in FIG. 1A, the first transmission line 11 is connected in series with the fourth transmission line 14 between the first port 1 and the third port 3. Additionally, the second transmission line 12 is connected between the fourth port 4 and the second port 2. In this embodiment, the fourth port 4 is electrically connected to a reference voltage, such as ground. Due to the inclusion of the fourth transmission line 14, the total length of transmission line between the first port 1 and the third port 3 is greater than the total length of transmission line between the fourth port 4 and the second port 2.

The first transmission line 11 and the second transmission line 12 are coupled to one another, for instance, negatively coupled magnetically. The first transmission line 11 and the second transmission line 12 can be magnetically coupled in a wide variety of ways, including, but not limited to, using the transmission line configurations of FIGS. 4A-5B. In certain implementations, the first transmission line 11 and the second transmission line 12 are tightly spaced to provide electromagnetic coupling of both magnetic and electric fields.

With continuing reference to the FIG. 1A, the third transmission line 13 is electrically connected in shunt with respect to the signal path through the first transmission line 11 and the fourth transmission line 14. For example, the third transmission line 13 is electrically connected between the third port 3 and a reference voltage, such as ground, in this example. In certain implementations, the third transmission line 13 is magnetically isolated from the first transmission line 11, the second transmission line 12, and/or the fourth transmission line 14.

When an unbalanced or single-ended signal is applied at the first port 1, a balanced or differential signal is generated between the third port 3 and the second port 2. Since the applied signal at the first port 1 is voltage divided by the impedances of the first transmission line 11 and the fourth transmission line 14, the third port 3 has about the same phase (non-inverted) as the signal at the first port 1. Furthermore, since the first transmission line 11 and the second transmission line 12 are negatively coupled magnetically, a phase inversion is provided at the second port 2.

Accordingly, when a single-ended signal is applied to the first port 1, the signal phase at the second port 2 is about 180 degrees different from the signal phase at the third port 3. Conversely, when a differential signal is applied between the third port 3 and the second port 2, the components of the differential signal combine to generate a single-ended signal as an output at the first port 1.

By including the fourth transmission line 14, the amplitude and/or phase balance of the wideband balun 20 is improved. For example, the fourth transmission line 14 can provide inductive compensation that enhances the amplitude and/or phase balance of the wideband balun 20 relatively to an implementation in which the fourth transmission line 14 is omitted. In certain implementations, the fourth transmission line 14 is magnetically isolated from the first transmission line 11, the second transmission line 12, and/or the third transmission line 13.

The wideband balun 20 can be implemented on a semiconductor die with a planar structure, rather than using a wire-wound magnetic core structure. Furthermore, the wideband balun 20 can be implemented on two or more metal layers during backend processing of a semiconductor die fabricated using a standard semiconductor integrated circuit (IC) process. Furthermore, the wideband balun 20 can be implemented with a relatively compact balun and without a magnetic core, which results in broader bandwidth and better amplitude and phase balance compared to the traditional on-chip balun structures.

An electronic system can incorporate one or more of the wideband baluns 20 to achieve high performance. For example, push-pull amplifiers, mixers, phase shifters, impedance transformers, and antenna feeds can have a performance impacted by a balun's operating characteristics. By using one or more instantiations of the wideband balun 20 in such systems, enhanced performance can be achieved.

Figure 1B:
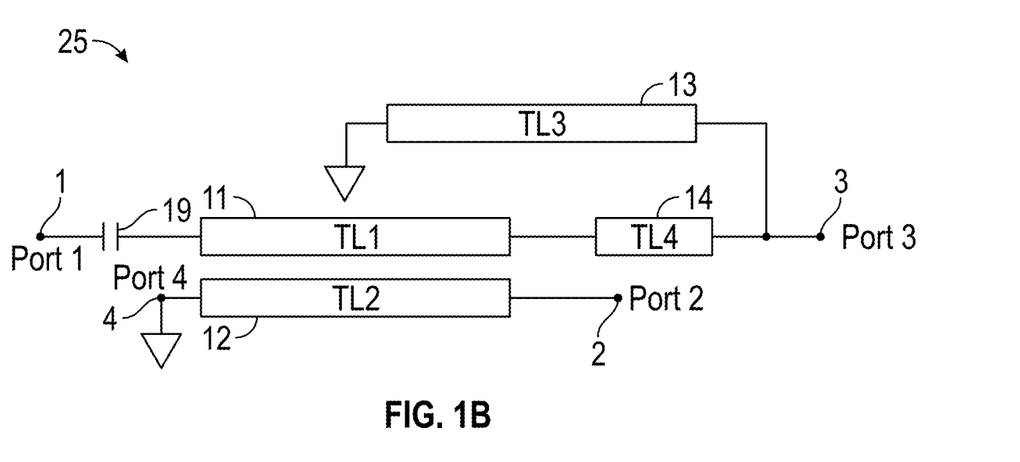
FIG. 1B is a schematic diagram of a wideband balun according to another embodiment.

FIG. 1B is a schematic diagram of a wideband balun 25 according to another embodiment. The wideband balun 25 of FIG. 1B is similar to the wideband balun 20 of FIG. 1A, except that the wideband balun 25 further includes a series capacitor 19, which is in series with the first transmission line 11 and the fourth transmission line 14 between the first port 1 and the third port 3.

Including the series capacitor 19 extends a low frequency bandwidth of the wideband balun 25. For example, a capacitance of the series capacitor 19 (along with a parasitic capacitance of the first transmission line 11 and/or a parasitic capacitance of the fourth transmission line 14) operates with an inductance at the first port 1 to generate a resonance that improves the return loss of the wideband balun 25. Accordingly, low frequency bandwidth can be extended.

Figure 2:
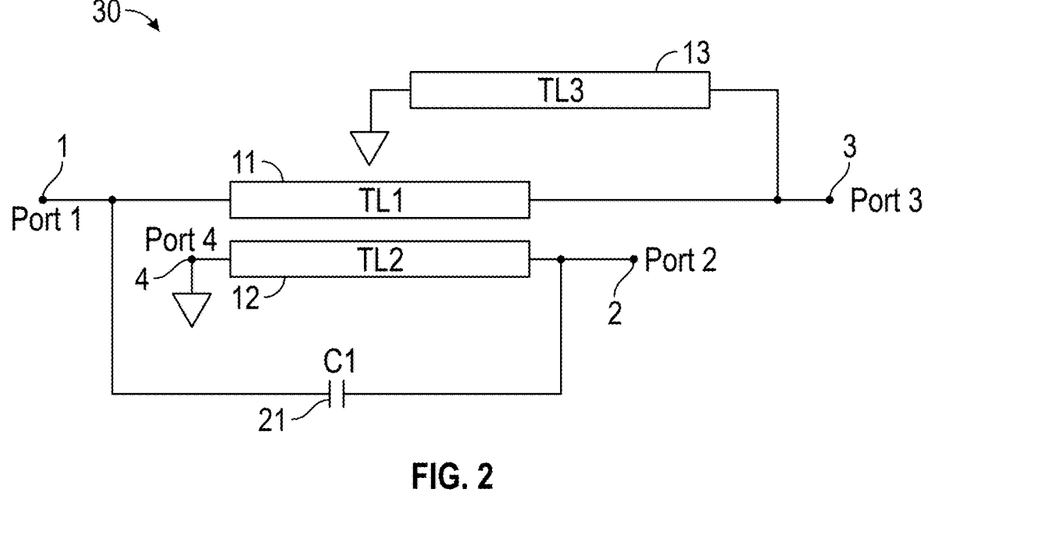
FIG. 2 is a schematic diagram of a wideband balun according to another embodiment.

FIG. 2 is a schematic diagram of a wideband balun 30 according to another embodiment. The wideband balun 30 includes a first port 1, a second port 2, a third port 3, a fourth port 4, a first transmission line 11, a second transmission line 12, a third transmission line 13, and a compensation capacitor 21 (also referred to herein as capacitor C1).

As shown in FIG. 2, the first transmission line 11 is connected between the first port 1 and the third port 3, and the second transmission line 12 is connected between the fourth port 4 and the second port 2. In this embodiment, the fourth port 4 is electrically connected to a reference voltage, such as ground. The first transmission line 11 and the second transmission line 12 are coupled to one another, for instance, negatively coupled magnetically. The first transmission line 11 and the second transmission line 12 can be magnetically coupled in a wide variety of ways, including, but not limited to, using the transmission line configurations of FIGS. 4A-5B.

With continuing reference to the FIG. 2, the third transmission line 13 is electrically connected in shunt with respect to the signal path from the first port 1 to the third port 3 through the first transmission line 11. For example, the third transmission line 13 is electrically connected between the third port 3 and a reference voltage, such as ground, in this example. In certain implementations, the third transmission line 13 is magnetically isolated from the first transmission line 11 and the second transmission line 12.

As shown in FIG. 2, the compensation capacitor 21 is electrically connected between the second port 2 and the first port 1, and operates to provide capacitance compensation to the wideband balun 30 to thereby enhance amplitude balance and/or phase balance. For example, capacitive compensation enhances the amplitude and/or phase balance of the wideband balun 30 relatively to an implementation in which the compensation capacitor 21 is omitted.

The wideband balun 30 can be implemented on a semiconductor die with a planar structure, rather than using a wire-wound magnetic core structure. Furthermore, the wideband balun 30 can be implemented on two or more metal layers during backend processing of a semiconductor die fabricated using a standard semiconductor IC process. One or more instantiations of the wideband balun 30 can be used in a push-pull amplifier, a balanced mixer, or other electronic system.

Figure 3A:
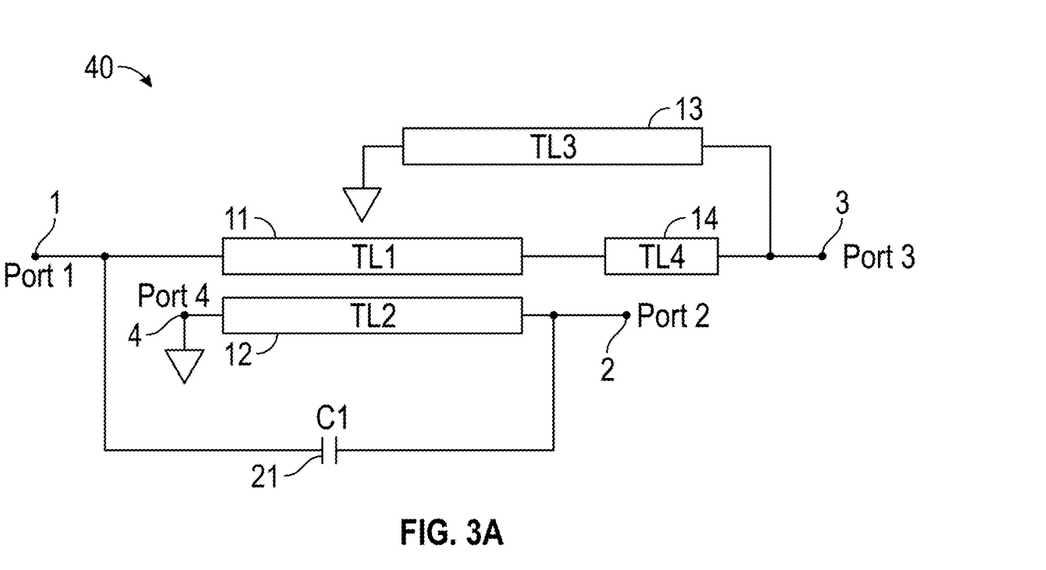
FIG. 3A is a schematic diagram of a wideband balun according to another embodiment.

FIG. 3A is a schematic diagram of a wideband balun 40 according to another embodiment. The wideband balun 40 a first port 1, a second port 2, a third port 3, a fourth port 4, a first transmission line 11, a second transmission line 12, a third transmission line 13, a fourth transmission line 14, and a compensation capacitor 21.

By implementing the wideband balun 40 with both the fourth transmission line 14 and the compensation capacitor 21, further enhancements in phase and/or amplitude balance can be achieved.

Figure 3B:
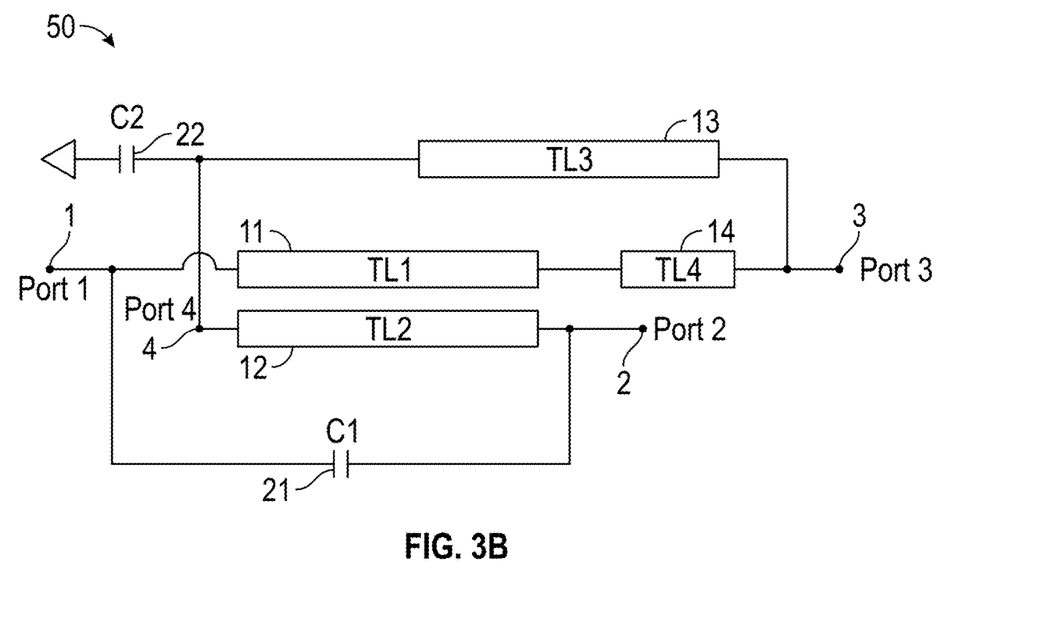
FIG. 3B is a schematic diagram of a wideband balun according to another embodiment.

FIG. 3B is a schematic diagram of a wideband balun 50 according to another embodiment. The wideband balun 50 of FIG. 3B is similar to the wideband balun 40 of FIG. 3A, except that the wideband balun 50 further includes a decoupling capacitor 22 (also referred to herein as capacitor C2).

As shown in FIG. 3B, the decoupling capacitor 22 includes a first end electrically connected to one end of the third transmission line 13 and to the fourth port 4, and a second end electrically connected to a reference voltage, such as ground. By including the decoupling capacitor 22, the first port 1 and the second port 2 are decoupled from ground DC potential, thereby enhancing flexibility of and/or simplifying DC biasing.

Figure 3C:
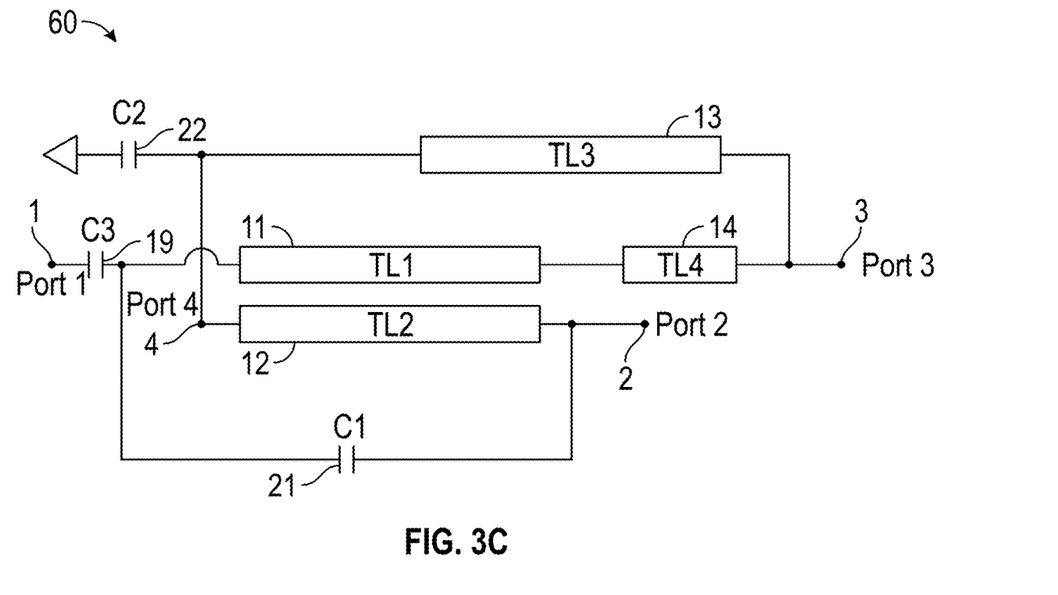
FIG. 3C is a schematic diagram of a wideband balun according to another embodiment.

FIG. 3C is a schematic diagram of a wideband balun 60 according to another embodiment. The wideband balun 60 of FIG. 3C is similar to the wideband balun 50 of FIG. 3B, except that the wideband balun 60 further includes the series capacitor 19 (also referred to herein as capacitor C3), which was described above with respect to FIG. 1B. Including the series capacitor 19 extends a low frequency bandwidth of the wideband balun 60.

Figure 4A:
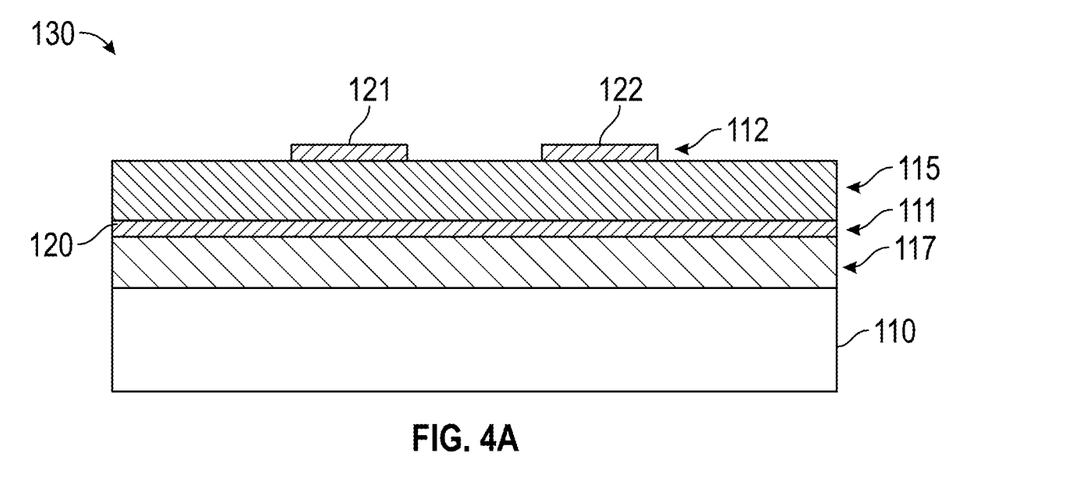
FIG. 4A is a schematic diagram of a cross-section of portion of a semiconductor die according to one embodiment.

FIG. 4A is a schematic diagram of a cross-section 130 of portion of a semiconductor die according to one embodiment. The cross-section 130 depicts a portion of the die's metallization layers, including a first conductive layer 111, a second conductive layer 112, and a first dielectric layer 115 that is between the first conductive layer 111 and the second conductive layer 112. The metallization layers are formed over a die substrate 110, and separated therefrom by another dielectric layer 117, in this embodiment.

As shown in FIG. 4A, the first conductive layer 111 includes a ground plane 120, while the second conductive layer 112 has been patterned to include a first transmission line 121 and a second transmission line 122.

Although FIG. 4A depicts a cross-section, persons of ordinary skill will appreciate that the first transmission line 121 and the second transmission line 122 have lengths extending at least in part in a direction perpendicular to the cross-section 130 (for instance, in a directional perpendicular to the figure sheet). For example, the first transmission line 121 and the second transmission line 122 can have coil or spiral shapes when viewed from above.

The first transmission line 121 and the second transmission line 122 illustrate one implementation of the first transmission line 11 and the second transmission line 12, respectively (or vice versa), of the wideband baluns of FIGS. 1A-3C. In the illustrated embodiment, the first transmission line 121 and the second transmission line 122 are edge-coupled.

Although not illustrated in FIG. 4A, one or more additional transmission lines (for instance, the third transmission line 13 and/or the fourth transmission line 14) can be implemented using the metallization layers of the semiconductor die. Furthermore, one or more capacitors can be implemented on-chip with the transmission lines, thereby providing an integrated and compact design.

In certain implementations, the cross-section 130 corresponds to that of a semiconductor die fabricated using a silicon process, such as a complementary metal oxide semiconductor (CMOS) process, a silicon-on-insulator process, or a silicon germanium process. However, other implementations are possible.

Figure 4B:
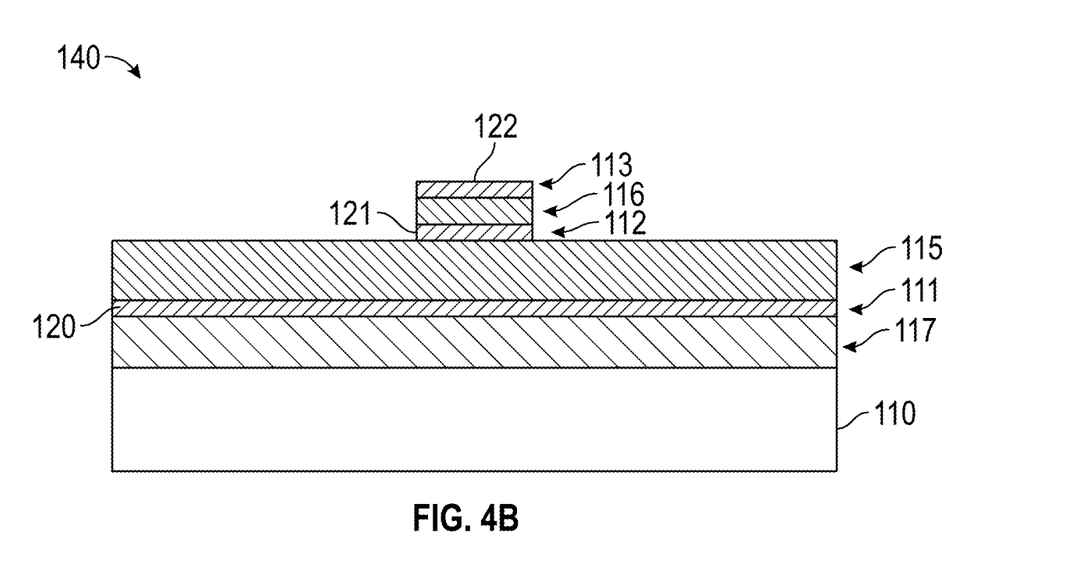
FIG. 4B is a schematic diagram of a cross-section of portion of a semiconductor die according to another embodiment.

FIG. 4B is a schematic diagram of a cross-section 140 of portion of a semiconductor die according to another embodiment. The cross-section 140 depicts a portion of the die's metallization layers, including a first conductive layer 111, a second conductive layer 112, a third metallization layer 113, a first dielectric layer 115, and a second dielectric layer 116. The first dielectric layer 115 is between the first conductive layer 111 and the second conductive layer 112, and the second dielectric layer 116 is between the second conductive layer 112 and the third conductive layer 113. The metallization layers are formed over a die substrate 110, and separated therefrom by another dielectric layer 117.

As shown in FIG. 4B, the first conductive layer 111 includes a ground plane 120, the second conductive layer 112 has been patterned to include a first transmission line 121, and the third conductive layer 113 has been patterned to include a second transmission line 122.

Although FIG. 4B depicts a cross-section, persons of ordinary skill will appreciate that the first transmission line 121 and the second transmission line 122 have lengths extending at least in part in a direction perpendicular to the cross-section 140. For example, the first transmission line 121 and the second transmission line 122 can have coil or spiral shapes when viewed from above.

The first transmission line 121 and the second transmission line 122 illustrate one implementation of the first transmission line 11 and the second transmission line 12, respectively (or vice versa), of the wideband baluns of FIGS. 1A-3C. In the illustrated embodiment, the first transmission line 121 and the second transmission line 122 are broadside-coupled. Although not illustrated in FIG. 4B, one or more additional transmission lines (for instance, the third transmission line 13 and/or the fourth transmission line 14) can be implemented using the metallization layers.

In certain implementations, the cross-section 140 corresponds to that of a semiconductor die fabricated using a silicon process, such as a CMOS process, a silicon-on-insulator process, or a silicon germanium process. However, other implementations are possible.

Figure 5A:
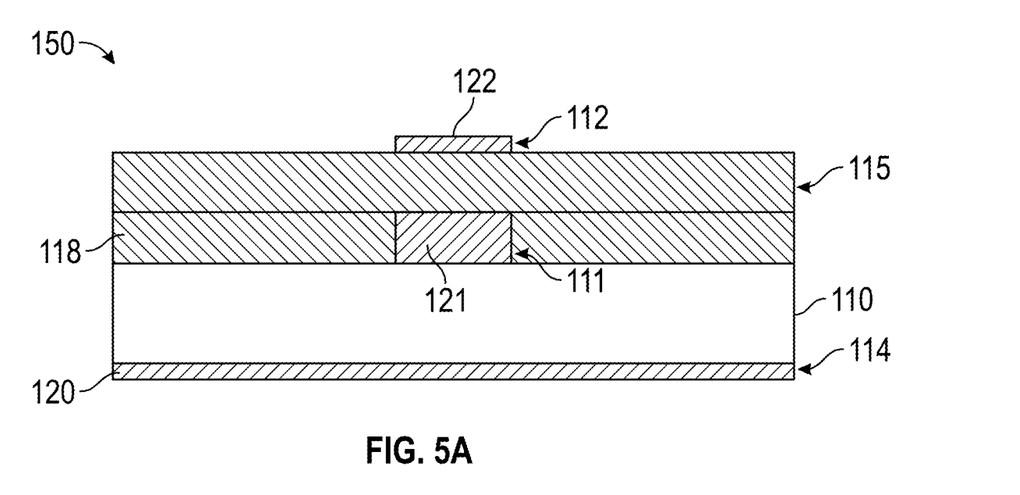
FIG. 5A is a schematic diagram of a cross-section of portion of a semiconductor die according to another embodiment.

FIG. 5A is a schematic diagram of a cross-section 150 of portion of a semiconductor die according to another embodiment. The cross-section 150 depicts a portion of the die's metallization layers, including a first conductive layer 111, a second conductive layer 112, a backside metallization layer 114, and a dielectric layer 115. The dielectric layer 115 is between the first conductive layer 111 and the second conductive layer 112. The first and second metallization layers are formed over a first side of a die substrate 110, while the backside metallization layer 114 is formed over a second side of the die substrate 110.

In the illustrated embodiment, the backside metallization layer 114 includes a ground plane 120. Additionally, the first conductive layer 111 has been patterned to include a first transmission line 121, and the second conductive layer 112 has been patterned to include a second transmission line 122. Additionally dielectric 118 is included where portions of the first conductive layer 111 were patterned.

Although FIG. 5A depicts a cross-section, persons of ordinary skill will appreciate that the first transmission line 121 and the second transmission line 122 have lengths extending at least in part in a direction perpendicular to the cross-section 150. For example, the first transmission line 121 and the second transmission line 122 can have coil or spiral shapes when viewed from above.

The first transmission line 121 and the second transmission line 122 illustrate one implementation of the first transmission line 11 and the second transmission line 12, respectively (or vice versa), of the wideband baluns of FIGS. 1A-3C. In the illustrated embodiment, the first transmission line 121 and the second transmission line 122 are broadside-coupled. Although not illustrated in FIG. 5A, one or more additional transmission lines (for instance, the third transmission line 13 and/or the fourth transmission line 14) can be implemented using the metallization layers.

In certain implementations, the cross-section 150 corresponds to that of a semiconductor die fabricated using a compound semiconductor process, such as gallium arsenide. However, other implementations are possible.

Figure 5B:
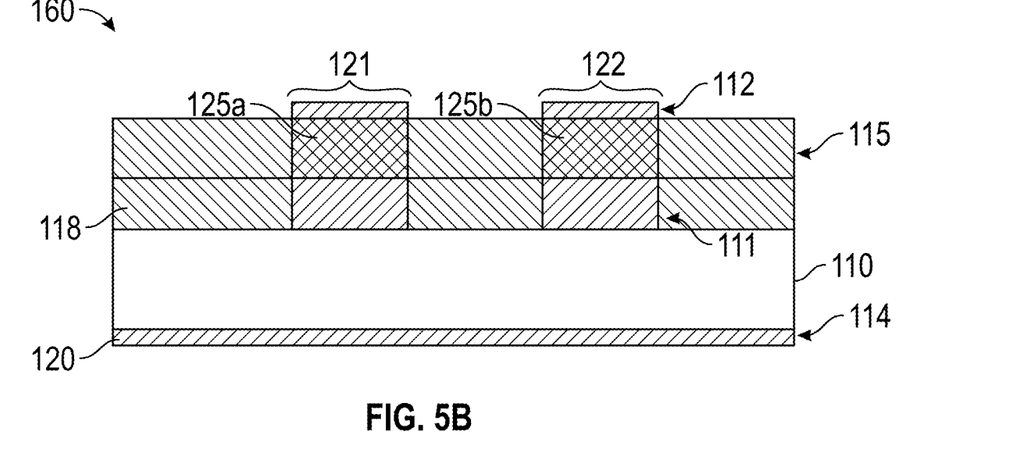
FIG. 5B is a schematic diagram of a cross-section of portion of a semiconductor die according to another embodiment.

FIG. 5B is a schematic diagram of a cross-section 160 of portion of a semiconductor die according to another embodiment. The cross-section 160 depicts a portion of the die's metallization layers, including a first conductive layer 111, a second conductive layer 112, a backside metallization layer 114, and a dielectric layer 115. The dielectric layer 115 is between the first conductive layer 111 and the second conductive layer 112. The first and second metallization layers are formed over a first side of a die substrate 110, while the backside metallization layer 114 is formed over a second side of the die substrate 110.

As shown in FIG. 5B, the backside metallization layer 114 includes a ground plane 120. Additionally, a first portion of the first conductive layer 111 and a first portion of the second conductive layer 112 have been patterned and interconnected with a first via 125a to form a first transmission line 121. Furthermore, a second portion of the first conductive layer 111 and a second portion of the second conductive layer 112 have been patterned and interconnected with a second via 125b to form a second transmission line 122. Furthermore, dielectric 118 is included where portions of the first conductive layer 111 were patterned.

Although FIG. 5B depicts a cross-section, persons of ordinary skill will appreciate that the first transmission line 121 and the second transmission line 122 have lengths extending at least in part in a direction perpendicular to the cross-section 160. For example, the first transmission line 121 and the second transmission line 122 can have coil or spiral shapes when viewed from above.

The first transmission line 121 and the second transmission line 122 illustrate one implementation of the first transmission line 11 and the second transmission line 12, respectively (or vice versa), of the wideband baluns of FIGS. 1A-3C. In the illustrated embodiment, the first transmission line 121 and the second transmission line 122 are edge-coupled on two metallization layers. Although not illustrated in FIG. 5B, one or more additional transmission lines (for instance, the third transmission line 13 and/or the fourth transmission line 14) can be implemented using the metallization layers.

In certain implementations, the cross-section 160 corresponds to that of a semiconductor die fabricated using a compound semiconductor process, such as gallium arsenide. However, other implementations are possible.

Figure 6A:
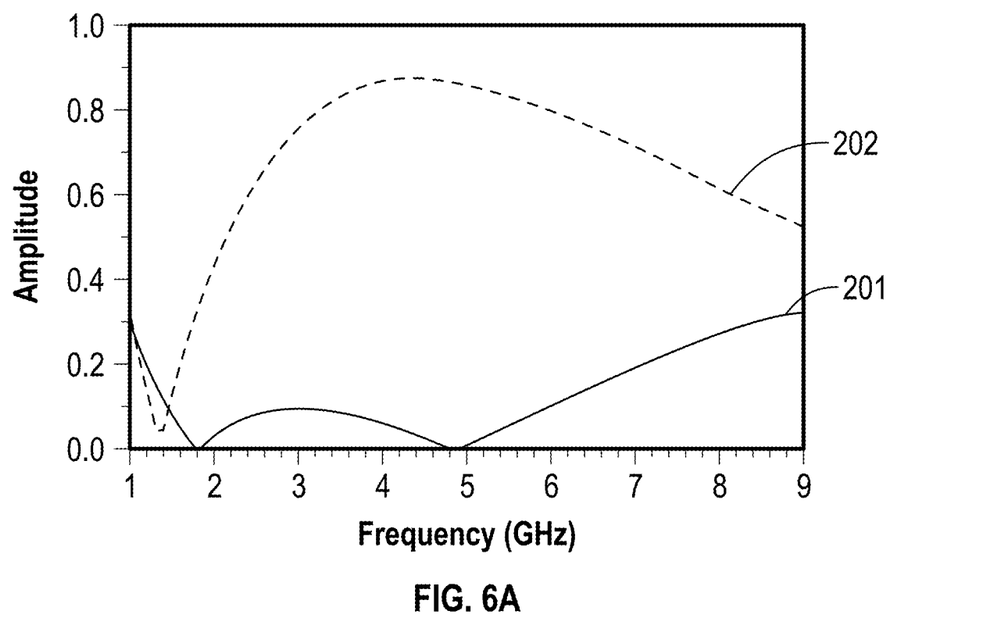
FIG. 6A is a graph of amplitude versus frequency plots for two examples of baluns.

FIG. 6A is a graph of amplitude versus frequency plots for two examples of baluns. The graph includes a first plot 201 for one implementation of the wideband balun 20 of FIG. 1A in which the first transmission line 11 and the second transmission line 12 are edge-coupled. The graph further includes a second plot 202 for another balun implementation in which the fourth transmission line 14 of FIG. 1A is omitted.

As shown in FIG. 6A, including the fourth transmission line 14 of FIG. 1A improves amplitude balance.

Figure 6B:
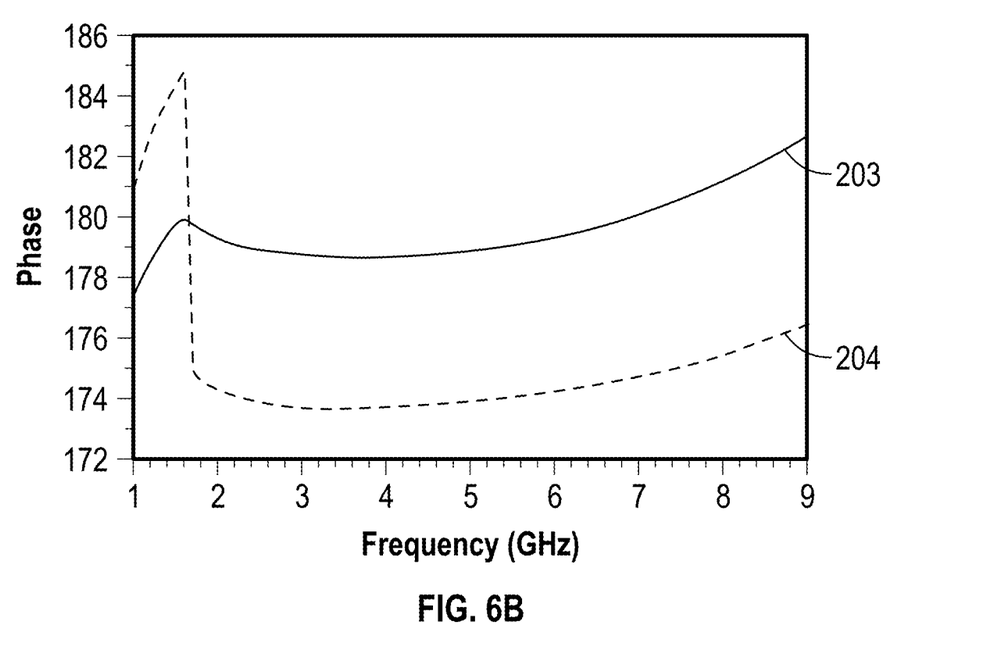
FIG. 6B is a graph of phase versus frequency plots for two examples of baluns.

FIG. 6B is a graph of phase versus frequency plots for two examples of baluns. The graph includes a first plot 203 for one implementation of the wideband balun 20 of FIG. 1A in which the first transmission line 11 and the second transmission line 12 are edge-coupled. The graph further includes a second plot 204 for another implementation in which the fourth transmission line 14 of FIG. 1A is omitted.

As shown in FIG. 6B, including the fourth transmission line 14 of FIG. 1A improves phase balance.

Figure 7A:
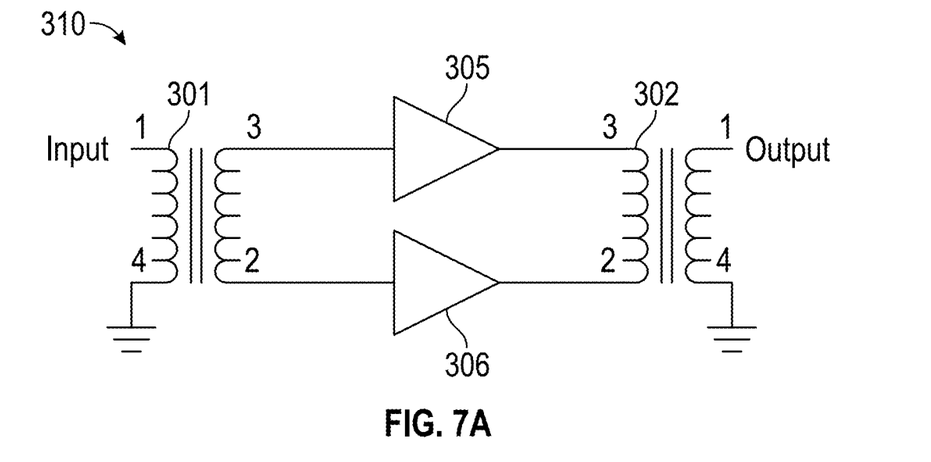
FIG. 7A is a schematic diagram of a push-pull amplifier according to one embodiment.

FIG. 7A is a schematic diagram of a push-pull amplifier 310 according to one embodiment. The push-pull amplifier 310 includes a first balun 301, a second balun 302, a first amplification circuit 305, and a second amplification circuit 306.

As shown in FIG. 7A, the first port of the first balun 301 receives a single-ended input signal, while the fourth port of the first balun 301 is grounded. Additionally, the first balun 301 operates to generate a differential input signal across the balun's third port and second port. The first amplifier 305 and second amplifier 306 amplify the differential input signal to generate a differential output signal that is applied across the third port and the second port of the second balun 302. Additionally, the fourth port of the second balun 302 is grounded, while the first port of the second balun 302 outputs a single-ended output signal.

As persons of ordinary skill in the art will appreciate, the first amplifier 305 and the second amplifier 306 operate in a push-pull configuration. Thus, even-order harmonics are rejected and distortion is lowered.

The push-pull amplifier 310 illustrates one embodiment of an electronic system that can include one or more baluns implemented in accordance with the teachings herein. For example, the first balun 301 and/or the second balun 302 can be implemented in accordance with any of the wideband baluns herein. By using wideband baluns in the push-pull amplifier 310, phase/amplitude balance is enhanced, thereby providing high OIP2 and/or HD2.

Figure 7B:
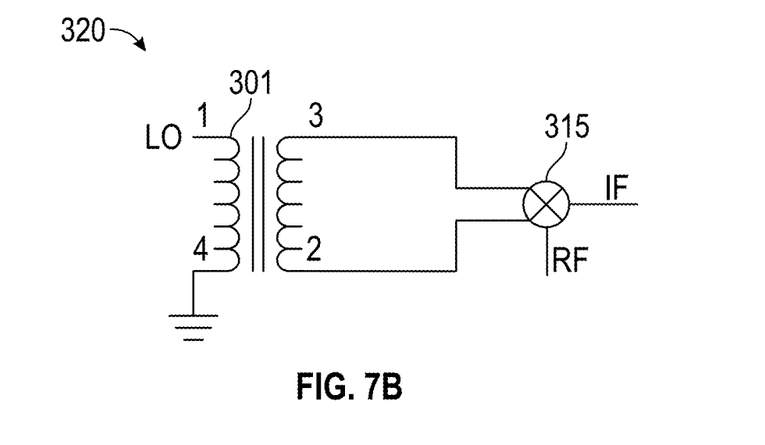
FIG. 7B is a schematic diagram of a single balanced mixer according to one embodiment.

FIG. 7B is a schematic diagram of a single balanced mixer 320 according to one embodiment. The single balanced mixer 320 includes a balun 301 and a mixer 315.

As shown in FIG. 7B, the first port of the balun 301 receives a single-ended local oscillator (LO) signal, while the fourth port of the balun 301 is grounded. Additionally, the balun 301 generates a differential LO signal between the third port and the second port. The differential LO signal is provided to a differential input of the mixer 315.

The mixer 315 further receives an intermediate frequency (IF) signal and generates a radio frequency (RF) signal, or vice versa. For example, the IF signal can be received and the RF signal generated when the single balanced mixer 320 is providing frequency upconversion, while the RF signal can be received and the IF signal generated when the single balanced mixer 320 is providing frequency downconversion.

The single balanced mixer 320 illustrates another embodiment of an electronic system implemented in accordance with the teachings herein. For example, the balun 301 can be implemented in accordance with any of the wideband baluns of FIGS. 1A-3C. Although FIG. 7B illustrates another embodiment of an electronic system, the wideband baluns disclosed herein can be used in a wide range of electronic systems.

Figure 7C:
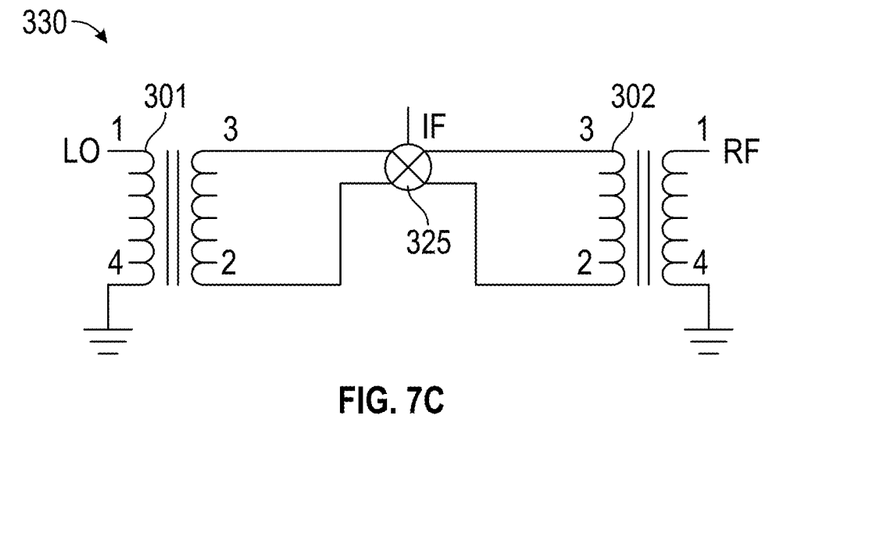
FIG. 7C is a schematic diagram of a double balanced mixer according to one embodiment.

FIG. 7C is a schematic diagram of a double balanced mixer 330 according to one embodiment. The double balanced mixer 330 includes a first balun 301, a second balun 302, and a mixer 325.

As shown in FIG. 7C, the first port of the first balun 301 receives a single-ended LO signal, while the fourth port of the first balun 301 is grounded. Additionally, the first balun 301 generates a differential LO signal between the balun's third port and second port, and provides the differential LO signal to a differential input of the mixer 325.

When providing frequency upconversion, the mixer 325 receives an IF signal, and generates a differential RF signal that is provided across the third port and the second port of the second balun 302. Additionally, the fourth port of the second balun 302 is grounded, and the first port of the second balun 302 outputs a single-ended RF signal.

When providing frequency downconversion, the second balun 302 receives the single-ended RF signal at the first port, and generates the differential RF signal across the balun's third port and second port. Additionally, the mixer 325 receives the differential RF signal, and generates the IF signal.

The double balanced mixer 330 illustrates another embodiment of an electronic system implemented in accordance with the teachings herein. For example, the first balun 301 and/or the balun 302 can be implemented in accordance with any of the wideband baluns of FIGS. 1A-3C. Although FIG. 7C illustrates another embodiment of an electronic system, the wideband baluns disclosed herein can be used in a wide range of electronic systems.

Figure 7D:
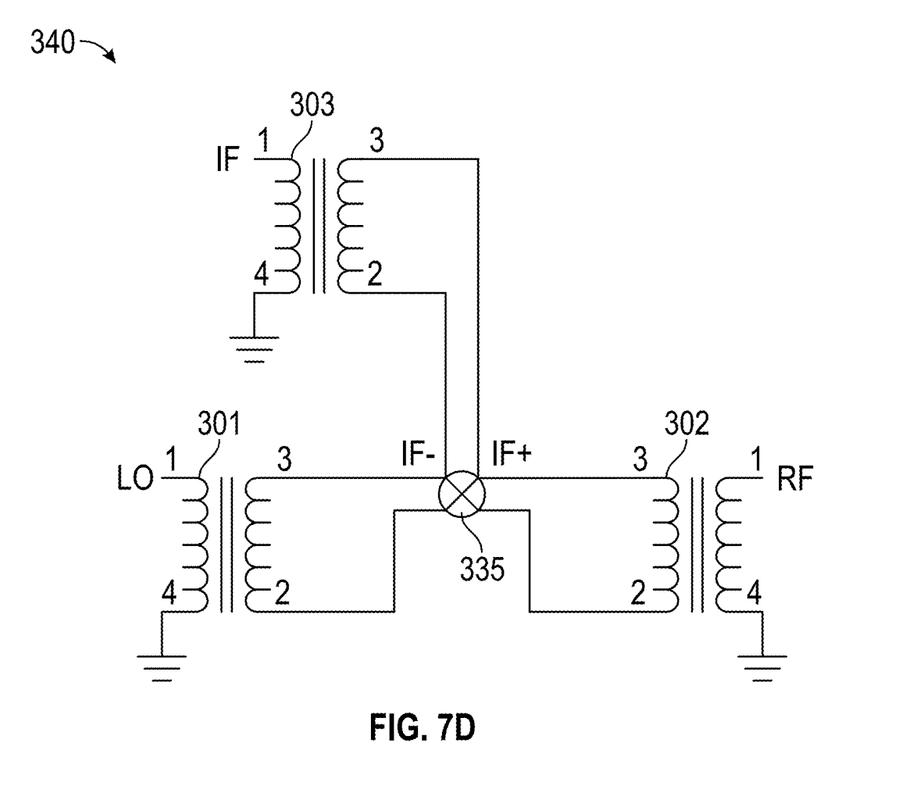
FIG. 7D is a schematic diagram of a double balanced mixer according to another embodiment.

FIG. 7D is a schematic diagram of a double balanced mixer 340 according to another embodiment. The double balanced mixer 340 includes a first balun 301, a second balun 302, a third balun 303, and a mixer 335.

The double balanced mixer 340 of FIG. 7D is similar to the double balanced mixer 330 of FIG. 7C, except that the double balanced mixer 340 of FIG. 7D further includes the third balun 303 to provide single-ended to differential signal conversion of the IF signal. Thus, when providing frequency upconversion, a single-ended IF signal is provided to the first port of the third balun 303 while the balun's fourth port is grounded, and a differential IF signal (IF+/IF−) is generated across the balun's third port and second port. Additionally, when providing frequency downconversion, the mixer 335 provides the differential IF signal across the third port and the second port of the third balun 303, and the first port of the third balun 303 outputs the signal-ended IF signal.

The double balanced mixer 340 illustrates another embodiment of an electronic system implemented in accordance with the teachings herein. For example, the first balun 301, the balun 302, and/or the third balun 303 can be implemented in accordance with any of the wideband baluns of FIGS. 1A-3C. Although FIG. 7D illustrates another embodiment of an electronic system, the wideband baluns disclosed herein can be used in a wide range of electronic systems.

Applications

Devices employing the above described schemes can be implemented into various electronic systems. Examples of the electronic systems can include, but are not limited to, consumer electronic products, parts of the consumer electronic products, electronic test equipment, communication infrastructure applications, etc. Further, the electronic systems can include unfinished products, including those for communication, industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A wideband balun with enhanced amplitude and phase balance, the wideband balun comprising:
    a plurality of ports including a first port, a second port, a third port, and a fourth port;
    a first transmission line electrically connected between the first port and the third port;
    a second transmission line electrically connected between the second port and the fourth port, wherein the first transmission line and the second transmission line are magnetically coupled;
    a decoupling capacitor;
    a third transmission line electrically connected in series with the decoupling capacitor between the third port and a reference voltage; and
    a compensation structure electrically connected to the first transmission line and operable to provide at least one of capacitive compensation or inductive compensation to balance the wideband balun.

2. The wideband balun of claim 1, wherein the compensation structure comprises a fourth transmission line in series with the first transmission line between the first port and the third port, the fourth transmission line operable to provide inductive compensation.

3. The wideband balun of claim 1, wherein the compensation structure comprises a compensation capacitor electrically connected between the first port and the second port, the compensation capacitor operable to provide capacitive compensation.

4. The wideband balun of claim 1, wherein the compensation structure comprises a fourth transmission line in series with the first transmission line between the first port and the third port, and a compensation capacitor electrically connected between the first port and the second port.

5. The wideband balun of claim 1, wherein the decoupling capacitor is configured to decouple the second port, the third port, and the fourth port from the reference voltage.

6. The wideband balun of claim 1, wherein the first transmission line and the second transmission line are edge coupled.

7. The wideband balun of claim 1, further comprising a ground plane, wherein the first transmission line and the second transmission line are stacked over the ground plane.

8. The wideband balun of claim 1, further comprising a series capacitor in series with the first transmission line between the first port and the third port.

9. The wideband balun of claim 1, wherein the fourth port is electrically connected to the reference voltage.

10. The wideband balun of claim 1, implemented in a push-pull amplifier.

11. The wideband balun of claim 1, implemented in a balanced mixer.

12. A semiconductor die having an integrated wideband balun, the semiconductor die comprising:
two or more metallization layers;
a first transmission line formed in the two or more metallization layers and electrically connected between a first port and a third port;
a second transmission line formed in the two or more metallization layers and electrically connected between a second port and a fourth port, wherein the first transmission line and the second transmission line are magnetically coupled;
a decoupling capacitor;
a third transmission line formed in the two or more metallization layers and electrically connected in series with the decoupling capacitor between the third port and a reference voltage; and
a compensation structure operable to compensate for imbalance between the second port and the third port.

13. The semiconductor die of claim 12, wherein the compensation structure includes a fourth transmission line formed in the two or more metallization layers and in series with the first transmission line between the first port and the third port.

14. The semiconductor die of claim 12, wherein the compensation structure includes a compensation capacitor electrically connected between the first port and the second port.

15. The semiconductor die of claim 12, wherein the first transmission line and the second transmission line are edge coupled on at least two of the two or more metallization layers.

16. The semiconductor die of claim 12, wherein the decoupling capacitor is configured to decouple the second port, the third port, and the fourth port from the reference voltage.

17. The semiconductor die of claim 12, fabricated in gallium arsenide (GaAs) or gallium nitride (GaN).

18. The semiconductor die of claim 12, further comprising a ground plane formed in the two or more metallization layers, wherein the first transmission line and the second transmission line are stacked over the ground plane.

19. The semiconductor die of claim 12, further comprising a series capacitor in series with the first transmission line between the first port and the third port.

20. A wideband balun comprising:
a plurality of ports including a first port, a second port, a third port, and a fourth port;
a first transmission line electrically connected between the first port and the third port;
a second transmission line electrically connected between the second port and the fourth port, wherein the first transmission line and the second transmission line are magnetically coupled;
a decoupling capacitor;
a third transmission line electrically connected in series with the decoupling capacitor between the third port and a reference voltage; and
means for compensating for an imbalance between the second port and the third port.

* * * * *